(12) United States Patent
Bonakdar et al.

(10) Patent No.: US 11,289,523 B2
(45) Date of Patent: Mar. 29, 2022

(54) IMAGE SENSOR WITH REDUCED PETAL FLARE

(71) Applicant: OMNIVISION TECHNOLOGIES, INC., Santa Clara, CA (US)

(72) Inventors: Alireza Bonakdar, San Jose, CA (US); Zhiqiang Lin, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 16/563,052

(22) Filed: Sep. 6, 2019

(65) Prior Publication Data

US 2021/0074751 A1   Mar. 11, 2021

(51) Int. Cl.
*H01L 27/00* (2006.01)
*H01L 27/146* (2006.01)

(52) U.S. Cl.
CPC .. *H01L 27/14623* (2013.01); *H01L 27/14605* (2013.01); *H01L 27/14607* (2013.01); *H01L 27/14621* (2013.01); *H01L 27/14625* (2013.01); *H01L 27/14627* (2013.01); *H01L 27/14645* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 10,686,000 B1 * | 6/2020 | Lin | H01L 27/14625 |
| 2017/0179189 A1 * | 6/2017 | Zheng | H01L 27/14627 |
| 2018/0059538 A1 * | 3/2018 | Yomori | G02F 1/133514 |
| 2018/0301491 A1 * | 10/2018 | Nakamoto | H01L 27/14685 |
| 2019/0067356 A1 * | 2/2019 | Lin | H01L 27/14621 |

* cited by examiner

*Primary Examiner* — Reema Patel
(74) *Attorney, Agent, or Firm* — Christensen O'Connor Johnson Kindness PLLC (57) ABSTRACT

An image sensor includes a substrate material, an array of the color filters, an array of waveguides and spacers. The substrate material includes a plurality of photodiodes disposed therein. The array of color filters are disposed over the substrate material. The array of waveguides are disposed over the substrate material. The buffer layer is disposed between the substrate material and the arrays of color filters and waveguides. The spacers are disposed between the color filters in the array of color filters. The spacers are disposed between the waveguides in the array of waveguides. Incident light is adapted to be confined between the spacers. The incident light is adapted to be directed through one of the waveguides and through one of the color filters prior to being directed through the buffer layer into one of the photodiodes in the substrate material.

20 Claims, 7 Drawing Sheets

IMAGE SENSOR WITH REDUCED PETAL FLARE

BACKGROUND INFORMATION

Field of the Disclosure

This disclosure relates generally to image sensor circuits, in particular to image sensor circuits with fully buried color filters including (but not exclusive to) high dynamic range (HDR) imaging.

Background

Image sensors may be used in various devices including cameras, sensors, and consumer electronics. Individual pixels in image sensors may leak light to other pixels and cause a deleterious petal flare in the sensed image. The source of leakage may come from high angle light passing through one pixel and penetrating to the adjacent pixel. High angle light may come from natural diffraction of light and reflection off the surface of lenses or protective glass on the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to image sensors and devices and methods for utilizing image sensors are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Image sensors for color images may include color filters and microlenses to focus incident light. The color filters may be separated by spacers. There may be a buffer layer between a substrate including photodiodes and the color filters. If the color filter and the spacers beside the color filter are too short, light may pass at a high angle through the buffer layer beneath the spacers to a photodiode of another pixel, causing petal flare in the sensed image. The high angle light may be caused by a part of sensed image with high intensity (such as from the sun) partially reflects incident light off the image sensor with a diffraction pattern due to periodicity of image sensor. The higher diffracted orders reflects back off portions of the imaging system (including lenses or glass covers) and is absorbed by pixels in a different region of sensor not associated with the part of the sensed image with high intensity and results in the petal flare.

Increasing the height of the spacers and distance between the microlenses and the buffer layer increases the angle at which incident light must pass through the buffer layer under the spacers, decreasing the amount of light that may leak through to a neighboring pixel. The optics of the microlenses also further reduces the amount of light passing through the buffer layer to a neighboring pixel. However, if the color filter's height is increased the color filter will absorb more light, reducing the sensitivity of the image sensor.

As will be discussed, example image sensors disclosed herein have an architecture that reduces petal flare caused by light leaking through the buffer layer to neighboring pixels without significantly reducing the sensitivity of the image sensor in accordance with the teachings of the present invention. In one example, a clear waveguide is disposed between the buffer layer and the microlenses, which may increase the height of the spacers and the distance between the microlenses and the buffer layer without absorbing light in accordance with the teachings of the present invention. Accordingly, a clear waveguide may reduce the amount of light leaking through the buffer layer under the spacers without significantly reducing the sensitivity of the image sensor, as well as having other advantages. In addition, the waveguide 'guides' incoming light into the corresponding pixel. Without the waveguide, a focused light from a microlens may spread laterally traveling away from focal point of the microlens. Larger spot area due to spreading may leads to leakage to adjacent pixel's upper layers such as adjacent color filter. Therefore, a waveguide may safely increase a distance between a microlens and the layers below the color filter. These advantages are especially useful in large photodiode/small photodiode (LPD/SPD) image sensors.

Figure 1:
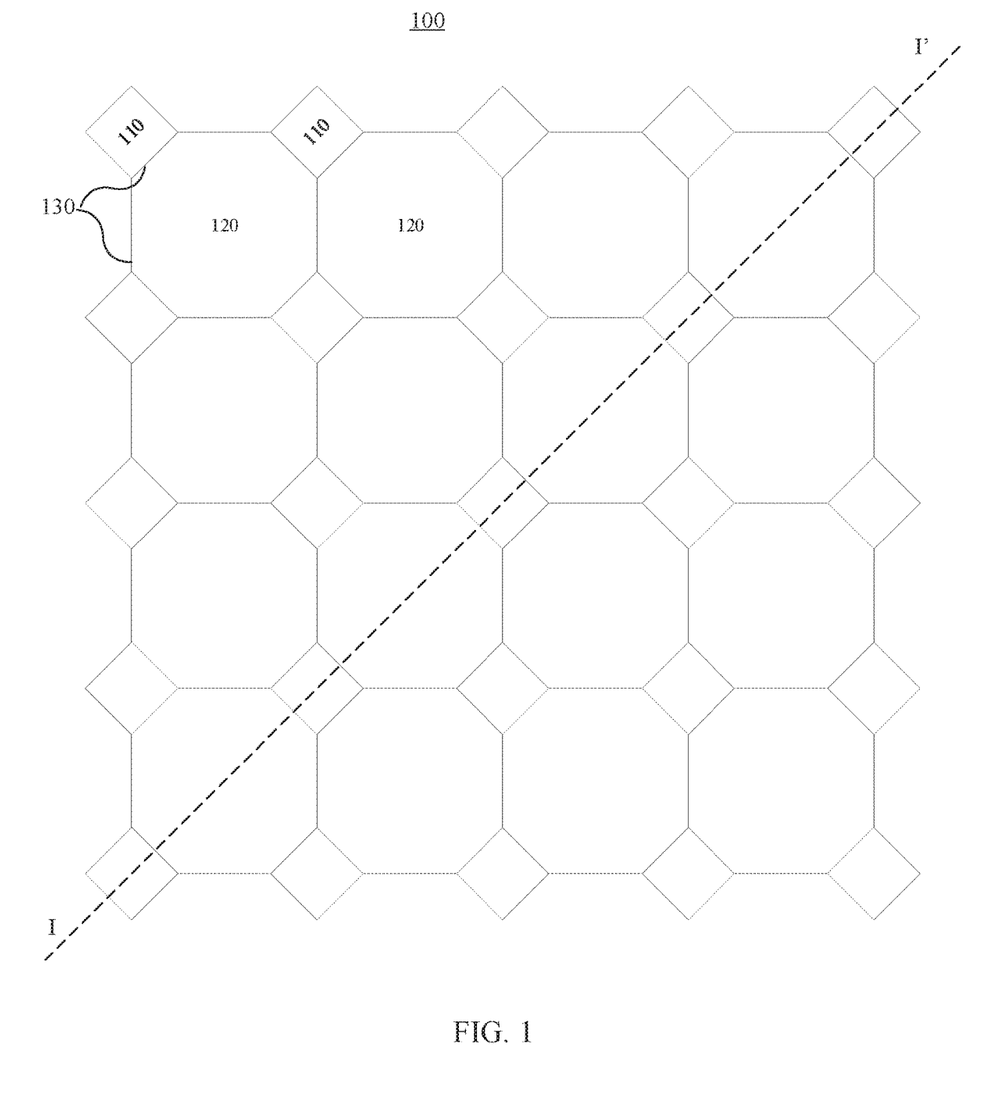
FIG. 1 illustrates an example image sensor in accordance with the teachings of the present invention.

To illustrate, FIG. 1 shows an example image sensor 100 in accordance with the teachings of the present invention. The image sensor 100 has an LPD/SPD layout using a high dynamic range (HDR) application. The large photodiodes are in the large pixels 120 and are laid out in a grid. The small photodiodes are in the small pixels 110 disposed between and around the large pixels 120. The small pixels 110 may be square and oriented 45 degrees from the orientation of the grid of large pixels 120. Both the small pixels 110 and the large pixels 120 may be surrounded by spacers 130. The spacers 130 improve the isolation of the small photodiodes and the large photodiodes. In the depicted example, the grid of large pixels 120 is illustrated as being 4×4, however the grid may have any size. The concepts described herein may apply to other photodiode layouts and pixel architectures.

Figure 2A:
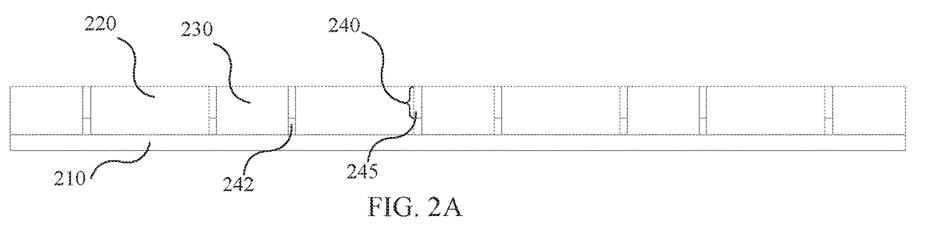
FIGS. 2A-K illustrate an example process of forming an image sensor in accordance with the teachings of the present invention.

FIGS. 2A-K illustrate an example of a process of forming an image sensor in accordance with the teachings of the present invention. FIG. 2A illustrates a buffer layer 210 upon which an array of color filters 220, 230 are formed, including large color filters 220 and small color filters 230. In one example and as will be described in greater detail below, it is appreciated that the buffer layer 210 and the array of color filters 220, 230 are disposed over a substrate material that includes a plurality of photodiodes disposed therein. As shown in the depicted example, the large color filters 220 and small color filters 230 have different dimensions. Spacers 240 are disposed between the individual color filters 220, 230. The spacers 240 may include a first spacer layer 245 as well as other layers, as discussed below. Below the first spacer layer 245 there may be an optional metal layer (or metal grid) 242. When included, the optional metal layer 242 may be below (with regard to the illustration of the figures, the device may be in any orientation) and aligned with the spacer 240. The metal layer 242 may be between and around the color filters, 220, 230.

The buffer layer 210 may include an oxide. The color filters 220, 230 may include a color filtering material. The metal layer 242 may be a metal (e.g. aluminum or titanium). The first spacer layer 245 may be made of a material with a low refractive index.

In the depicted example, the small color filters 230 and other materials between the spacers 240 are aligned over small photodiodes in the underlying substrate material and may be an example of the small pixel 110 of FIG. 1. Continuing with the depicted example, the large color filters 220 and other material between the spacers 240 are aligned over large photodiodes in the underlying substrate material and may be an example of the large pixel 120 of FIG. 1.

Figure 2B:
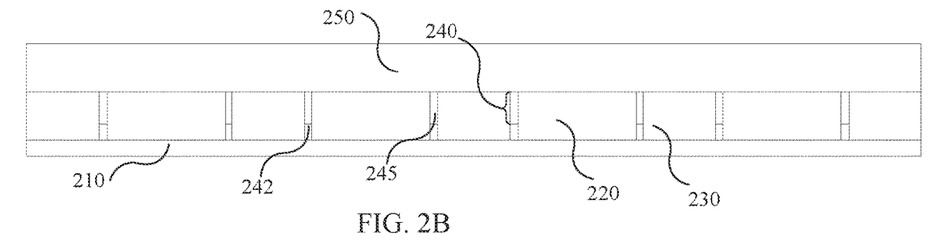

FIG. 2B illustrates the device of FIG. 2A with a clear film 250 formed on the array of color filters 220, 230 and the spacers 240. The clear film 250 may be made of transparent material having a higher refractive index than the first spacer layer 245.

Figure 2C:
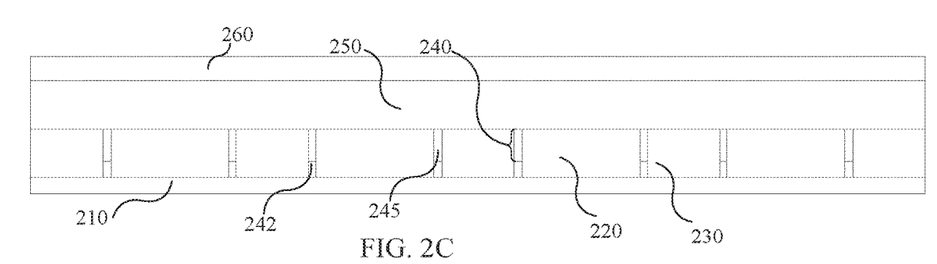

FIG. 2C illustrates the device of FIG. 2B with a photoresist layer 260 formed on the clear film 250. The photoresist layer 260 may be a photoresist material.

Figure 2D:
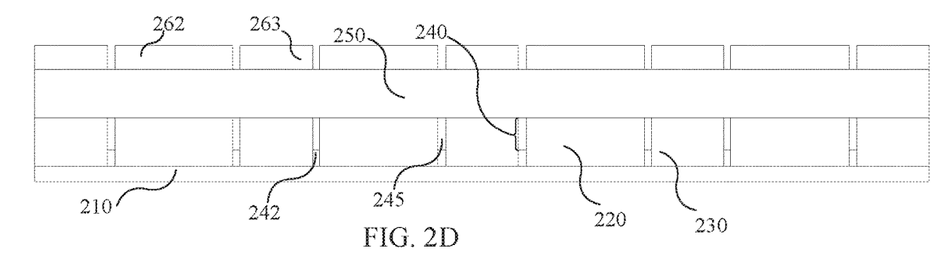

FIG. 2D illustrates the device of FIG. 2C with the photoresist layer 260 etched to form a mask pattern 262, 263. The mask pattern 262, 263 includes large mask pattern blocks 262 over and aligned with the large color filters 220. The mask pattern 262, 263 also includes small mask pattern blocks 263 over and aligned with the small color filters 230.

Figure 2E:
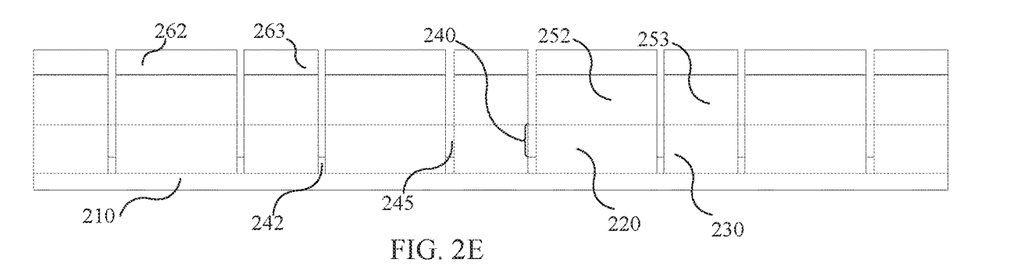

FIG. 2E illustrates the device of FIG. 2D with the clear film 250 etched to form an array of waveguides 252, 253, including large waveguides 252 and small waveguides 253, using the mask pattern 262, 263. The large waveguides 252 are above and aligned with the large color filters 220. The small waveguides 253 are above and aligned with the small color filters 230.

Figure 2F:
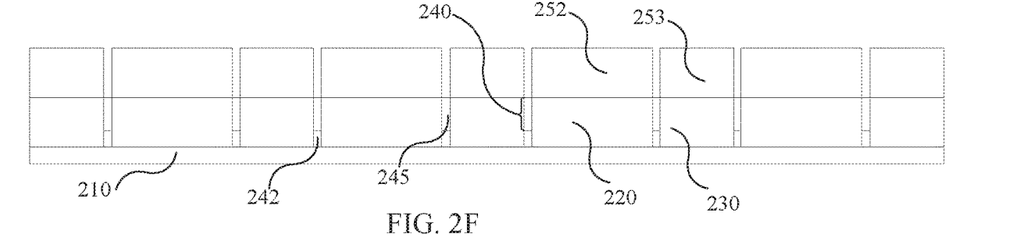
Figure 2G:
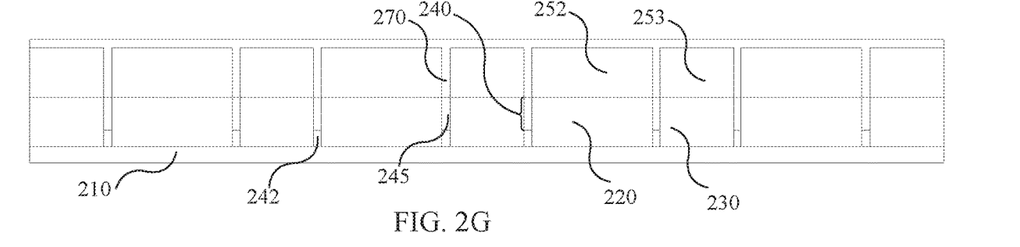

FIG. 2F illustrates the device of FIG. 2E with the mask pattern 262, 263 removed. FIG. 2G illustrates the device of FIG. 2F with a filler film 270 formed in the gaps between the waveguides 252 and 253. The filler film 270 may be formed of the same material as the first spacer layer 245. Alternatively, the filler film 270 may be formed of a different material with a low refractive index. A portion of the filler film 270 may cover the tops of the waveguides 252, 253. The filler film 270 and the first spacer layer 245 are formed of a low refractive index material compared to the refractive index of the waveguide material and the color filter material so that incident light passing through the waveguide 252, 253 or color filter 220, 230 will be absorbed or reflected off the spacer 240 rather than penetrate through the spacer 240 due to the difference in the refractive indexes of the materials.

Figure 2H:
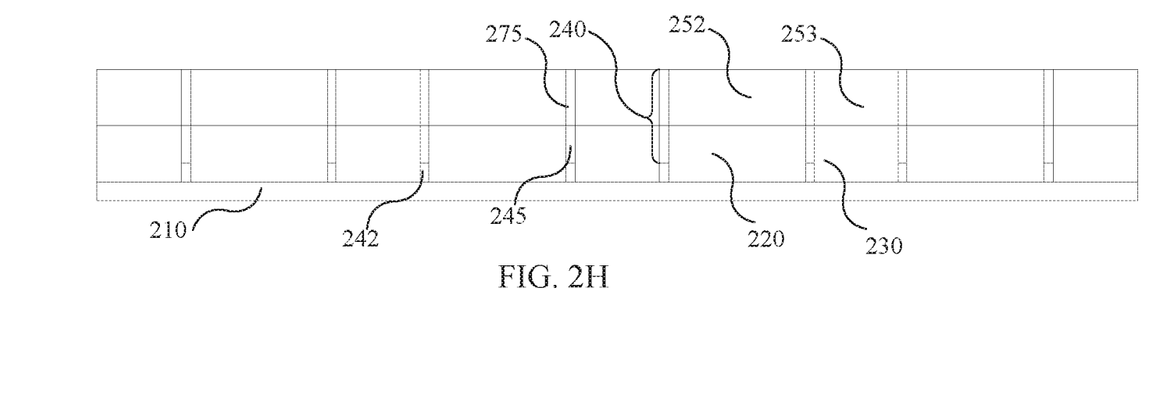

FIG. 2H illustrates the device of FIG. 2G with the filler film 270 covering the tops of the waveguides 252, 253 removed. The removal of the filler film 270 from the top of the waveguides 252, 253 forms the second spacer layer 275 from the filler film 270. As shown, spacers of the second spacer layer 275 are disposed between the individual waveguides 252, 253. In one example, the spacers of second spacer layer 275 may be considered as being part of spacers 240 with the first spacer layer 245.

Figure 2I:
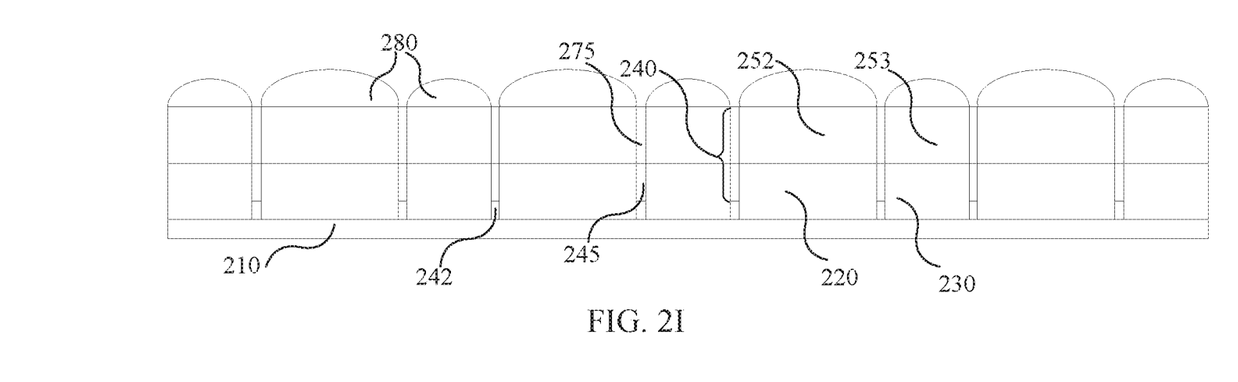

FIG. 2I illustrates the device of FIG. 2H with microlenses 280 formed over each of the waveguides 252, 253. The microlenses 280 may be made of a transparent material.

Figure 2J:
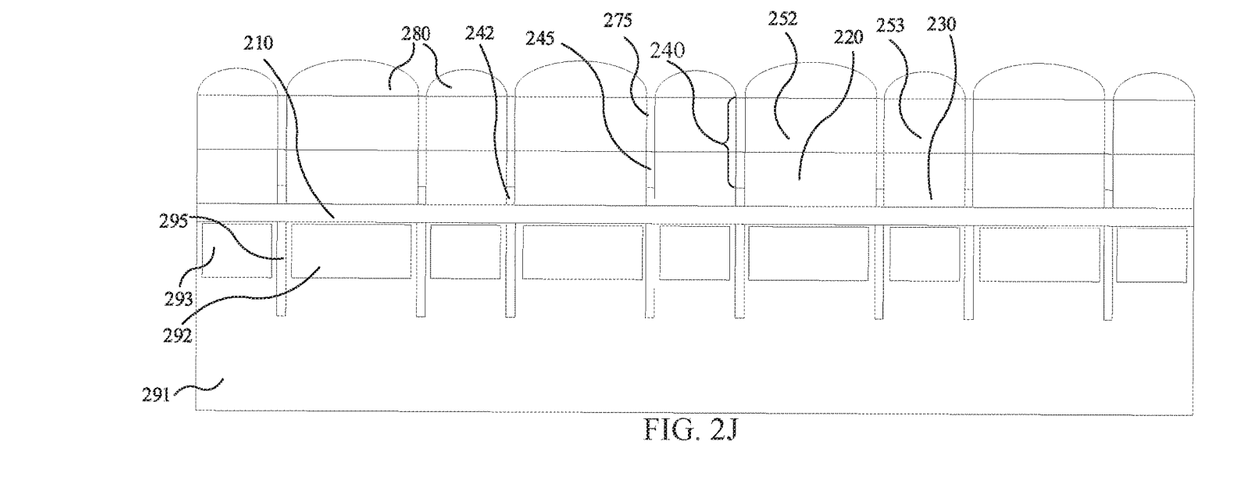

FIG. 2J illustrates the device of FIG. 2I on a substrate material 291 including photodiodes 292 and 293 and third spacer layer 295. The large photodiode 292 may be below and aligned with the large color filter 220 and large waveguide 252. The small photodiode 293 may be below and aligned with the small color filter 230 and small waveguide 253. Accordingly, the large photodiode 292, the large waveguide 252, the large color filter 220, and corresponding microlenses 280 may be an example of the large pixel 120 of FIG. 1. Similarly, the small photodiode 293, the small waveguide 253, the small color filter 230, and corresponding microlens 280 may be an example of the small pixel 110 of FIG. 1.

The substrate material 291 may include silicon. The photodiodes 292, 293 may be formed by processes known in the art. The third spacer layer 295 may include an electrically insulating material such as a polymer and/or oxide to electrically isolate the photodiodes 292, 293.

Figure 2K:
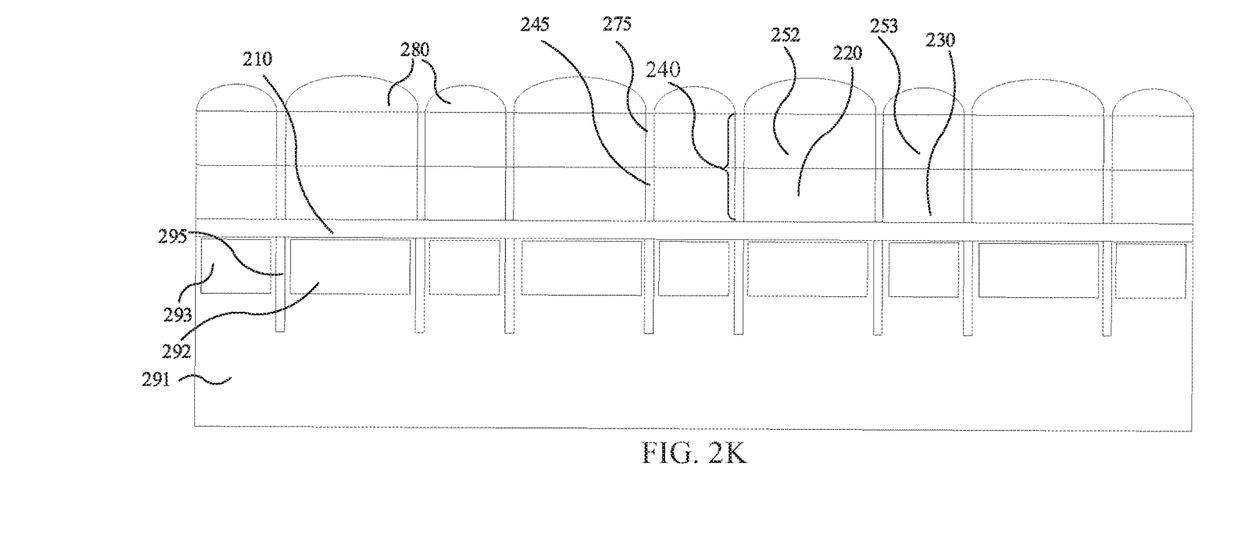

FIG. 2K illustrates an alternative embodiment similar to FIG. 2J except that the example illustrated in FIG. 2K does not include the optional metal layer 242. Accordingly, the first spacer layer 245 directly contacts the buffer layer 210. The metal layer 242 in the example depicted in FIG. 2K reduces the leakage of light to neighboring pixels and reflect light toward the photodiode 292, 293. The inclusion of the waveguides 252, 253 and second spacer layers 275 causes the microlenses 280 to be further from the buffer layer 210 and the angle at which incident light must pass through the buffer layer 210 to reach neighboring pixels to increase. Accordingly, the apparent size of the portion of the buffer layer 210 through which the incident light may pass to reach the neighboring pixels is reduced. Further, the optics of the microlenses 280 cause the amount of light at the bottom edge of the color filters 220, 230 to be reduced. Accordingly, leakage of incident light through the buffer layer 210 to neighboring pixels is significantly reduced. Accordingly, in some embodiments, the optional metal layer 242 may be omitted to reduce fabrication complexity and costs.

The spacers 240, and microlenses 280 are arranged such that incident light is generally confined between the spacers 240. The incident light is directed through one of the waveguides 252, 253 and through one of the color filters 220, 230 prior to being directed through the buffer layer 210 into one of the photodiodes 292, 293 in the substrate material.

The problem of light leakage to neighboring pixels may be especially pronounced in LPD/SPD sensors because the large pixels 120 allow incident light at a higher angle to pass through the buffer layer 210 under the spacer 240 to a neighboring small photodiode 293. Also, the small photodiode 293 is saturated by less light. Accordingly, petal flare at the small photodiodes 293 is more likely to occur.

One cause of incident light entering the pixels at a high angle is reflection off of internal components (not shown) of an image sensing device. Due to the periodicity of the image sensor 100, the angle at which these reflections occur may be known and the height of the second spacer layer 275 (and the waveguides 252, 253) may be designed to block these reflections from passing through the buffer layer 210 under the spacers 240.

Either of examples illustrated in FIG. 2K or FIG. 2J may correspond to a cross-sectional view along the line I-I' in FIG. 1. Along the line I-I', the photodiodes 292, 293, color filters 220, 230, and waveguides 252, 253 alternate between large photodiodes 292 and small photodiodes, large color filters 220 and small color filters 230, and large waveguides 252 and small waveguides 253. The large pixel 120 may include the photodiode 292, the color filter 220, the waveguide 252, and the microlens 280. The small pixel 110 may include the photodiode 293, the color filter 230, the waveguide 253, and the microlens 280. The spacers 130 may correspond to the spacers 240.

Restating the relative relationships of the elements illustrated in the examples of FIG. 2K and FIG. 2J, the buffer layer 210 is disposed between the substrate material 291 and the arrays of color filters 220, 230 and waveguides 252, 253. The array of waveguides 252, 253 is disposed between the array of microlenses 280 and the array of color filters 220, 230. In FIG. 2K, the optional metal layer 242 is disposed between the spacers 240 and the buffer layer 210.

Figure 3:
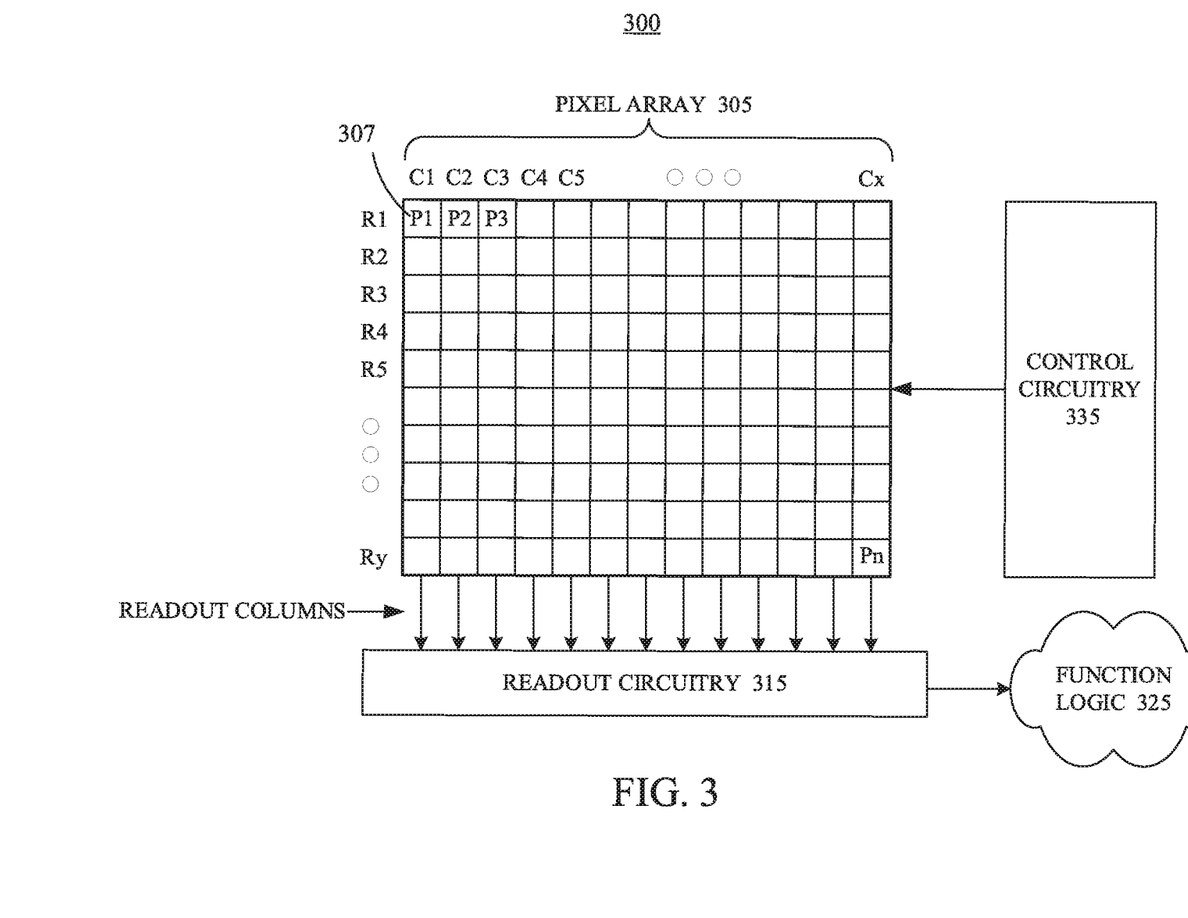
FIG. 3 is a diagram illustrating one example of an imaging system with a pixel array in accordance with the teachings of the present invention.

FIG. 3 is a diagram illustrating one example of an imaging system 300 with a pixel array 305 in accordance with the teachings of the present invention. As shown in the depicted example, an imaging system 300 includes a pixel array 305 coupled to a control circuitry 335 and a readout circuitry 315, which is coupled to a function logic 325.

Pixel array 305 is a two-dimensional ("2D") array of pixels 307 (e.g., pixels P1, P2 . . . , Pn). In one embodiment, each pixel is a complementary metal-oxide-semiconductor ("CMOS") imaging pixel. Pixel array 305 may be implemented as either a front side illuminated image sensor array or a backside illuminated image sensor array. In one embodiment, pixel array 305 includes a pixel array, such as the pixel array depicted in FIG. 1, FIG. 2J, or FIG. 2K. The pixel array 305 includes a plurality of pixels 307. As illustrated, each pixel 307 is arranged into a row (e.g., rows R1 to Ry) and a column (e.g., column Cl to Cx) to acquire image data of a person, place, or object, which can then be used to render a 2D image of the person, place, or object.

In one embodiment, after each pixel 307 has acquired its image data or image charge, the image data is readout by readout circuitry 315 and transferred to function logic 325. Readout circuitry 315 may include amplification circuitry, e.g., a differential amplifier circuitry, analog-to-digital ("ADC") conversion circuitry, or otherwise.

Function logic 325 may include logic and memory for storing the image data or even manipulating the image data by applying post image effects (e.g., crop, rotate, remove red eye, adjust brightness, adjust contrast, or otherwise). In one example, the readout circuitry 315 may readout a row of image data at a time along readout column lines (illustrated) or may readout the image data using a variety of other techniques (not illustrated), such as a serial readout or a full parallel readout of all pixels simultaneously.

Control circuitry 335 is coupled to pixel array 305. Control circuitry 335 may include logic and memory for controlling operational characteristic of pixel array 305. For example, control circuit 335 may generate a shutter signal for controlling image acquisition. In one embodiment, the shutter signal is a global shutter signal for simultaneously enabling all pixels 307 within pixel array 305 to simultaneously capture their respective image data during a single acquisition window. In an alternative embodiment, the shutter signal is a rolling shutter signal whereby each row, column, or group of pixels is sequentially enabled during consecutive acquisition windows.

Figure 4:
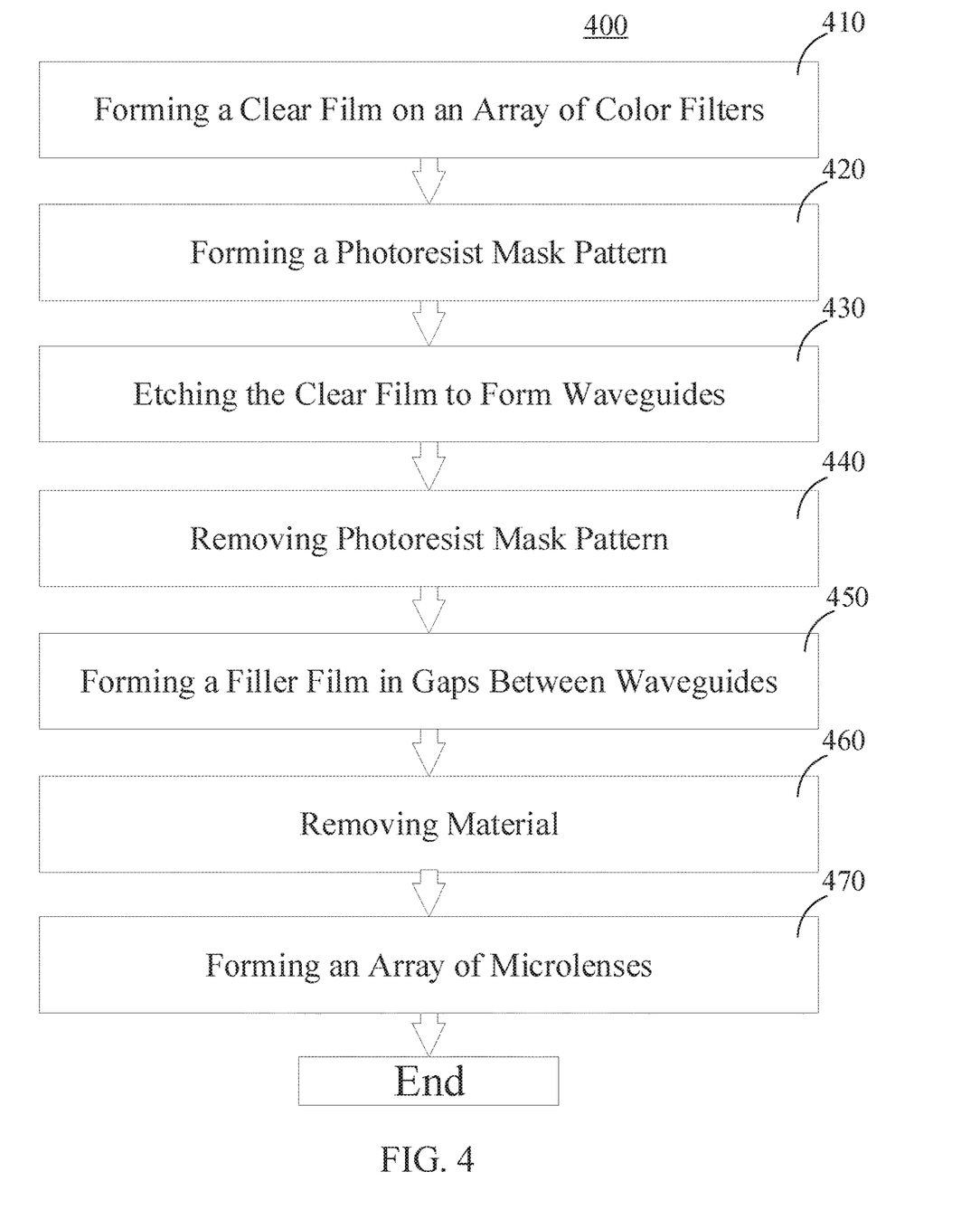
FIG. 4 illustrates an example flow diagram illustrating a process of forming an image sensor in accordance with the teachings of the present invention.

FIG. 4 illustrates example flow diagram 400 illustrating a process of forming an image sensor in accordance with the teachings of the present invention. At block 410, a clear film 250 may be formed on an array of color filters 220, 230. The clear film 250 may be formed by a spin coating process.

At block 420, a photoresist mask pattern 262, 263 may be formed on the clear film 250. The photoresist mask pattern 262, 263 may be formed by spin coating photoresist layer 260 on the clear film 250. The photoresist layer 260 may then be developed to form the photoresist mask pattern 262, 263. Large photoresist blocks 262 and small photoresist blocks 263 form the photoresist mask pattern 262, 263. The large photoresist blocks 262 may be above and aligned with large color filters 220. The small photoresist blocks 263 may be above and aligned with small color filters 230. Accordingly, the photoresist mask pattern 262, 263, may match the layout of the array of color filters 220, 230 in a plane, such as the plane of view shown in FIG. 1.

At block 430, the clear film 250 may be etched using the photoresist mask pattern 262, 263 as a mask. The etching of the clear film 250 may form the waveguides 252 and 253. The etched away sections of the clear film 250 may be above and aligned with first spacer layer 245. At block 440, the photoresist mask pattern 262, 263 may be removed.

At block 450, a filler film 270 may be formed between and over the waveguides 252, 253 using a spin coating process. At block 460, material may be removed including part of the filler film 270 formed above the waveguides 252, 253. Some of the material removed may include residual photoresist material and some material from the top of the waveguides 252, 253. The material may be removed using a chemical mechanical planarization process. The removal of the part of the filler film 270 forms the second spacer layer 275. The first spacer layer 245 and the second spacer layer 275 together may form spacer 240. Spacer 240 is between and surrounds the color filters 220, 230. The spacer 240 also is between and surrounds the waveguides 252, 253.

At block 470, an array of microlenses 280 may be formed on the waveguides 252, 253 using techniques known in the art. Each microlens 280 may be formed above and aligned with one of the waveguides 252, 253. Each microlens 280 may also be formed above and aligned with one of the color filters 220, 230. Further microlens 280 may be formed above and aligned with a photodiode 292, 293. Accordingly, one pixel may be formed to comprise a photodiode 292, 293, a color filter 220, 230, a waveguide 252, 253, and the microlens 280.

As can be appreciated by the above description of the circuitry and operating modes for the controlling the circuitry, the disclosure provides for an image sensor 100 with improved performance with regards to deleterious petal flare in sensed images.

The above description of illustrated examples of the present invention, including what stop is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor, comprising:
   a plurality of photodiodes disposed within a substrate material;
   an array of color filters;
   an array of waveguides;
   a buffer layer disposed between the substrate material and the array of color filters, wherein the buffer layer is further disposed between the substrate material and the array of waveguides;
   spacers including first spacers and second spacers, wherein the first spacers are disposed between color filters included in the array of color filters, wherein the second spacers are disposed between waveguides included in the array of waveguides, wherein the spacers are positioned to confine, at least in part, light between the spacers such that the light propagates through the waveguides, the color filters, and the buffer layer to be incident on at least one photodiode included in the plurality of photodiodes when the light is incident upon the image sensor, and wherein the first spacers have a first refractive index that is less than both a second refractive index of the color filters and a third refractive index of the waveguides, and
   wherein the first spacers and the second spacers are characterized by a uniform width between the color filters and the waveguides, respectively, such that a first fixed width of each of the first spacers is equal to a second fixed width of each of the second spacers.

2. The image sensor of claim 1, wherein the array of waveguides is formed of a transparent material such that the third refractive index of the waveguides is greater than a fourth refractive index of the second spacers such that the spacers deflect the light to confine the light, at least in part, between the spacers when the light is incident upon the image sensor.

3. The image sensor of claim 1, wherein each one of the waveguides included in the array of waveguides is aligned with a corresponding color filter included in the array of color filters, and wherein the color filters are disposed between the waveguides and the buffer layer.

4. The image sensor of claim 1, wherein the first spacers directly contact the buffer layer, wherein each one of the second spacers directly contacts a corresponding one of first spacers, and wherein the first spacers are disposed between the second spacers and the buffer layer.

5. The image sensor of claim 1, wherein the buffer layer includes an oxide material.

6. The image sensor of claim 1, wherein at least some of the color filters included in the array of color filters have different dimensions with respect to other color filters included in the array of color filters.

7. The image sensor of claim 6, wherein along a first direction across the array of color filters, the color filters alternate between larger color filters and smaller color filters included in the array of color filters.

8. The image sensor of claim 1, further comprising an array of microlenses optically aligned with the array of waveguides, wherein the array of waveguides is disposed between the array of microlenses and the array of color filters.

9. The image sensor of claim 1, further comprising a metal grid disposed between the spacers and the buffer layer such that the spacers do not directly contact the buffer layer.

10. The image sensor of claim 9, wherein the metal grid is further disposed between the color filters in the array of color filters.

11. The image sensor of claim 1, further comprising third spacers disposed within the substrate material between adjacent photodiodes included in the plurality of photodiodes, and wherein each of the third spacers is aligned with a corresponding one of the first spacers and a corresponding one of the second spacers.

12. A method of forming an image sensor, comprising:
    providing a plurality of photodiodes disposed within a substrate material, wherein the plurality of photodiodes is disposed proximate to a buffer layer, wherein the buffer layer is disposed between an array of color filters and the plurality of photodiodes, and wherein first spacers included in spacers are disposed between color filters included in the array of color filters;
    forming a clear film on the array of color filters with the first spacers disposed between the color filters array of color filters, wherein the color filters are disposed between the clear film and the buffer layer;
    etching the clear film, wherein the etched clear film forms an array of waveguides;
    forming a filler film in gaps between waveguides included in the array of waveguides to form second spacers;
    removing at least a portion of the filler film such that the second spacers included in the spacers are disposed between the waveguides, wherein the spacers are positioned to confine, at least in part, light between the spacers such that the light propagates through the waveguides, the color filters, and the buffer layer to be incident on at least one photodiode included in the plurality of photodiodes when the light is incident upon the image sensor, and wherein the first spacers have a first refractive index that is less than both a second refractive index of the color filters and a third refractive index of the waveguides, and wherein the first spacers and the second spacers are characterized by a uniform width between the color filters and the waveguides, respectively, such that a first fixed width of each of the first spacers is equal to a second fixed width of each of the second spacers.

13. The method of claim 12, wherein the filler film and the first spacers are made of a same material such that a fourth refractive index of the second spacers is less than the second refractive index of the color filters and the third refractive index of the waveguides.

14. The method of claim 12, wherein said removing the material includes performing chemical mechanical planarization to remove the portion of the filler film from above the array of waveguides.

15. The method of claim 12, further comprising forming microlenses on the array of waveguides, wherein each microlens included in the microlenses is optically aligned with at least one of the waveguides, and wherein the waveguides are disposed between the microlenses and the color filters.

16. The method of claim 12, wherein at least some of the color filters included in the array of color filters have different dimensions with respect to other color filters included in the array of color filters.

17. The method of claim 16, wherein along a first direction across the array of color filters, the color filters alternate between larger color filters and smaller color filters included in the array of color filters.

18. The method of claim 12, wherein the third refractive index of the waveguides is greater than a fourth refractive index of the second spacers such that the first spacers and the second spacers deflect the light, at least in part, between both the first spacers and the second spacers when the light is incident upon the image sensor.

19. The method of claim 12, further comprising:
forming a photoresist layer on the clear film;
etching the photoresist layer to form a photoresist pattern, wherein said etching the clear film includes using the photoresist pattern as a mask; and
removing the photoresist pattern.

20. The method of claim 19, wherein the photoresist pattern substantially matches a layout of the array of color filters in a first plane.

* * * * *